United States Patent [19]
Meier

[11] Patent Number: 5,500,909
[45] Date of Patent: Mar. 19, 1996

[54] SENSOR HEAD FOR A FIBER-OPTIC CURRENT MEASURING DEVICE

[75] Inventor: Markus Meier, Aarau, Switzerland

[73] Assignee: ABB Research Ltd., Zurich, Switzerland

[21] Appl. No.: 191,587

[22] Filed: Feb. 4, 1994

[30] Foreign Application Priority Data

Feb. 17, 1993 [DE] Germany .......................... 43 04 762.9

[51] Int. Cl.$^6$ .............................. G02B 6/00; G01R 31/00; G01J 4/00
[52] U.S. Cl. .......................... 385/12; 250/227.17; 324/96; 324/117 R; 356/351
[58] Field of Search .......................... 385/11, 12; 324/96, 324/97, 117 R, 72.5; 250/227.17, 227.24; 356/350, 345

[56] References Cited

U.S. PATENT DOCUMENTS

| | | | |
|---|---|---|---|
| 4,255,018 | 3/1981 | Ulrich et al. ........................ | 385/125 X |
| 4,697,876 | 10/1987 | Dyott ................................. | 385/12 |
| 4,883,337 | 11/1989 | Dahlgren .......................... | 385/134 |
| 5,051,577 | 9/1991 | Lutz et al. ........................ | 250/227.17 |
| 5,063,290 | 11/1991 | Kersey ............................. | 250/227.17 |
| 5,295,207 | 3/1994 | Dupraz et al. ..................... | 385/12 |
| 5,371,593 | 12/1994 | Cordova et al. ................... | 356/350 |

OTHER PUBLICATIONS

"Faseroptische Sensoren", Bohnert, et al., Bulletin SEV/VSE 82 (1991), pp. 17–29.

*Primary Examiner*—Rodney B. Bovernick
*Assistant Examiner*—Hemang Sanghavi
*Attorney, Agent, or Firm*—Burns, Doane, Swecker & Mathis

[57] ABSTRACT

The sensor head (1) is intended for a fiberoptic current measuring device. It exhibits a twisted low-birefringence LB fiber (14) which is guided around a current conductor (2) and serves to conduct polarized light. Using the LB fiber (14), the Faraday rotation of the polarized light, which rotation is generated by the magnetic field (H) of the current (J) to be measured, is detected. The LB fiber (14) is spliced at its two ends in each instance with one of two polarization-conserving, light-conducting HB fibers (6, 7), one (6) of which supplies the polarized light. The two HB fibers (6, 7) are secured in each instance in the vicinity of the two splice locations (19, 20) with the absorption of the torsional force generated by the twisting of the LB fiber (14).

In spite of having a simple and sturdy structure, the sensor head (1) is distinguished by a high degree of measurement accuracy.

19 Claims, 1 Drawing Sheet

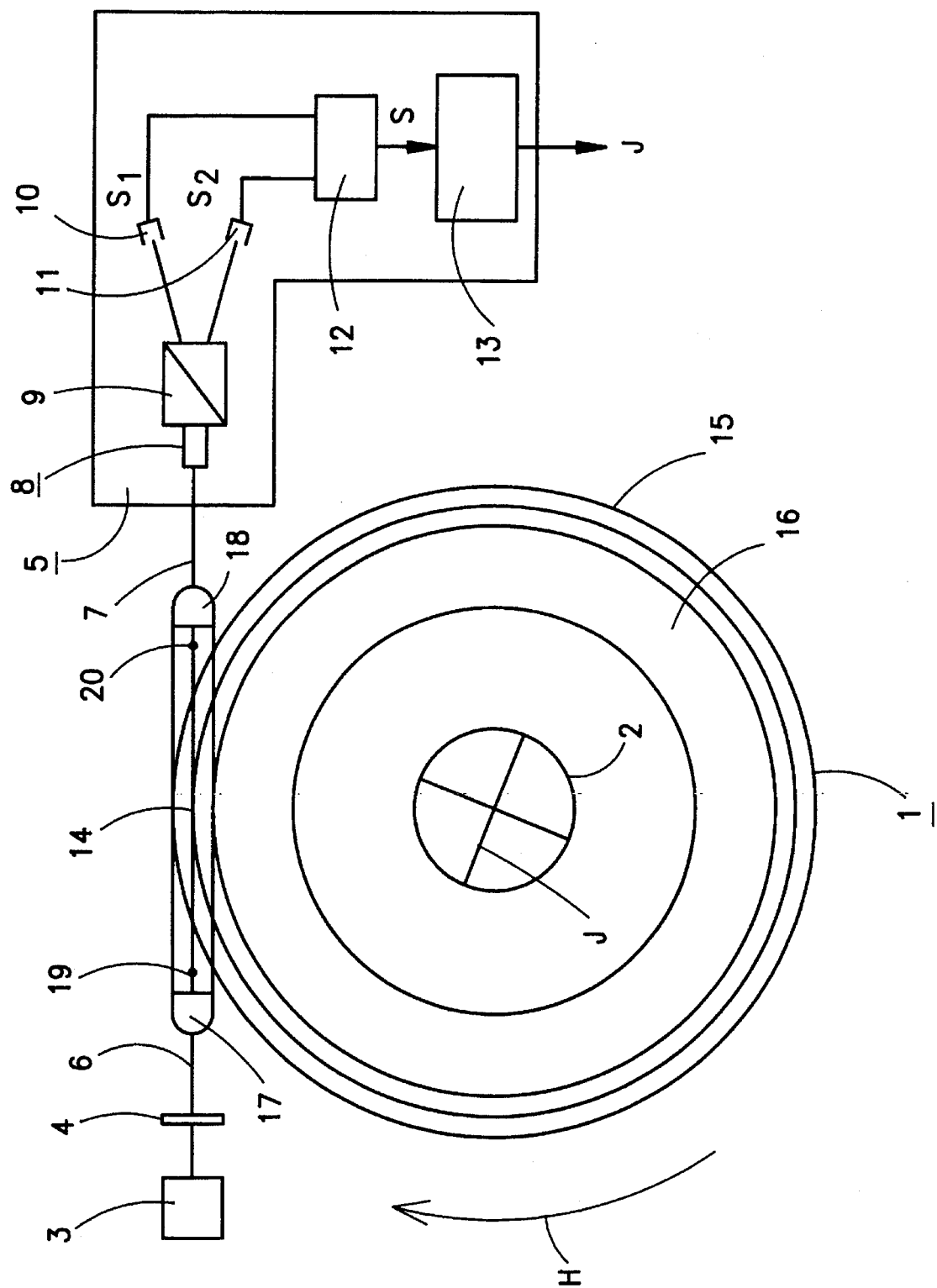

SENSOR HEAD FOR A FIBER-OPTIC CURRENT MEASURING DEVICE

BACKGROUND OF THE INVENTION

Field of the Invention

The starting point for the invention is a sensor head for a fiber-optic current measuring device according to the preamble of Patent claim 1.

DISCUSSION OF BACKGROUND

In this case, the invention relates to a prior art as evident from, for example, the publication by K. Bohnert and R. Stierlin: fiber-optic sensors, Bulletin SEV/VSE 82(1991)1, pp. 21–29. In FIG. 6, this publication describes a basic diagram of a fiber-optic current sensor with polarimetric detection. This current sensor exhibits a sensor head, surrounding a current-carrying conductor, with a low-birefringence sensor fiber (LB fiber). The LB fiber is wound in the form of a coil around the current conductor. Linearly polarized light is passed from a light source to the LB fiber via a polarization-conserving fiber (HB fiber). In the LB fiber, the polarized light executes a Faraday rotation under the influence of the magnetic field of the conductor current. The polarized light which is modified by the Faraday rotation and which contains information on the magnitude of the conductor current is passed via a further (polarization-conserving) HB fiber to a detection and evaluation device, in which the value of the conductor current is determined.

The accuracy of such a sensor is essentially determined by birefringence which is induced, for example, by bending of the LB fiber in the course of the winding of the coil. In order to reduce drastically the influence of this birefringence, the LB fiber is additionally twisted mechanically about the fiber axis as well. As a result of the torsional stress occurring in this case, a controllable circular birefringence now occurs, which is substantially greater, depending upon the degree of twisting, and the birefringence which is induced by bending stresses upon the winding of the coil and which is difficult to detect.

SUMMARY OF THE INVENTION

Accordingly, one object of the invention as defined in Patent claim 1 is to provide a novel sensor head for a fiber-optic current measuring device, which sensor head, in spite of having a simple and sturdy structure, is distinguished by a high degree of accuracy of measurement.

The sensor head according to the invention is distinguished by a simple and sturdy structure and also gives very accurate measured values even under difficult operational conditions. This is due, on the one hand, to the fact that its optical active parts are practically all constructed using fiber technology. On the other hand, this is however also a consequence of a virtually force-free arrangement of the low-birefringence LB fiber which acts as current sensor. This fiber is actually spliced with polarization-conserving HB fibers and is fixed only via the HB fibers in the vicinity of the splice locations.

The polarized light executing the Faraday rotation is coupled in, in an extremely simple and effective manner, into the LB fiber acting as Faraday rotator, and at the same time undesired mechanical forces falsifying the Faraday rotation are kept away from the LB fiber by fixing the HB fibers which are insensitive to mechanical and thermal stresses.

A preferred embodiment of the invention and the further advantages which can be attained thereby are explained in greater detail hereinbelow with reference to a drawing.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein the drawing shows an embodiment of the invention in simplified form, and more specifically the single Figure shows a view, directed in the direction of a current conductor, of a sensor head according to the invention, which sensor head is disposed in a fiber-optic current measuring device shown for the most part only in the form of a basic diagram.

DESCRIPTION OF THE PREFERRED EMBODIMENTS

Referring now to the drawings, in the sole FIG. 1 denotes a sensor head of a fiber-optic current measuring device. A current conductor 2 is guided through the sensor head 1. Current J flowing in the current conductor 2 through the plane of the drawing generates a magnetic field H which is directed in the direction of an arrow. The fiber-optic current measuring device exhibits, besides a sensor head 1, also a light source 3 which is preferably constructed as a laser diode, a polarizer 4 and a detection and evaluation unit 5. A light guide (not designated by a reference numeral) conducts the light of the light source 3 to the polarizer 4, in which linearly polarized light is generated. The polarized light is passed by means of a polarization-conserving fiber 6, preferably comprising quartz, a so-called HB fiber, into the sensor head 1, in which the supplied light executes a Faraday rotation on account of the magnetic field H. Polarized light emerging from the sensor head is passed by means of a further polarization-conserving fiber preferably also comprising quartz, the HB fiber 7, into the detection and evaluation unit 5. HB fibers such as the fibers 6 and 7 inherently exhibit a high degree of birefringence and can be acted upon by large mechanical forces without their polarization-optical properties being disturbed within a wide temperature range (−40° C.– 80° C.). HB fibers do moreover exhibit in the direction of propagation of the polarized light two mutually orthogonal axes, in which the linear polarization of the light is not influenced.

The detection and evaluation unit 5 includes a polarimeter 8 with, for example, a Wollaston prism 9 as well as two photodetectors 10, 11, a device 12 for the determination of a signal S taking up the Faraday rotation and thus the magnitude of the current to be measured in the sensor head 1, and a device 13 for the determination of the value of the current J to be measured.

The sensor head 1 includes, as current sensor, a fiber which is wound in the shape of a coil around the current conductor 2 and which exhibits low birefringence and preferably also comprises quartz, a so-called LB fiber 14. The LB fiber 14 is twisted about its fiber axis and is guided in a capillary 15 which is wound in the form of a coil and preferably also comprises quartz glass. The capillary 15 typically has a diameter of 0.2 to 0.5 mm and is resiliently mounted on a rigid coil carrier body 16. This resilient mounting is preferably achieved in that the capillary 15 is embedded in an elastomer, for example silicone rubber, resting on the coil carrier body 16. The two polarization-conserving HB fibers 6, 7 are inserted in each instance at opposite ends into the capillary 15 and are secured in the region of the two insertion openings in each instance by means of an adhesive connection 17, 18 at the capillary 15. The adhesive connections 17, 18 are preferably formed of an elastomer, such as in particular a silicone.

The fibers 6 and 14 or respectively 14 and 7 are spliced to one another in a permanent and stable fashion at their mutually facing ends. In this case, the splice locations 19 and 20 are formed by fusion. The two splice locations 19 and 20 in the interior of the capillary 1.5 are disposed as close as possible to one another in order to avoid extraneous field sensitivity. The adhesive connections 17 and 18 are situated in the vicinity of the splice locations.

In place of a light guide and a polarizer 4, a fiber generating polarized light can be spliced in, between the light source 3 and the entrance of the LB fiber 6, by fusion. The sensor head of the fiber-optic current measuring device then essentially only still includes fiber elements and can accordingly be constructed in a simple and space-saving manner.

In the course of a measurement of the current J conducted in the current conductor 2, linearly polarized light passes from the polarizer 4 or the fiber provided in place of the polarizer 4, into the LB fiber 6. On account of its polarization-conserving properties, the HB fiber 6 guarantees that in spite of the adhesive connection 17 generating mechanical stresses in the fiber 6, the polarized light is conducted without disturbance into the LB fiber 14.

The LB fiber 14 is held at the two splice locations 19 and 20 in a virtually force-free manner. The torsional stress generated by its twisting is transferred via the two splice locations 19 and 20, the two HB fibers 6, 7 and the two adhesive connections 17, 18 to the capillary 15. Since the LB fiber 14 comprises a material which exhibits the same coefficient of thermal expansion as the capillary 15, temperature changes generate no compressive or tensile stresses in the LB fiber 14. The polarization-optical properties of the LB fiber 14 remain virtually unchanged. This is of particular advantage, since an LB fiber normally reacts sensitively, with respect to its polarization-optical properties, even under the action of small mechanical forces. In addition, mechanical forces generated by differing material expansions between the coil carrier body 16 and the capillary 15 in consequence of temperature changes are absorbed by the capillary 15 and are kept away from the LB fiber 14. In this case, as a result of the embedding of the capillary 15 into an elastomer the forces occurring in the event of temperature changes between coil carrier body 16 and capillary 15 are homogenized and undesired stress peaks are avoided.

The plane of polarization of the polarized light pulsing through the LB fiber 14 executes a current-strength-dependent Faraday rotation under the influence of the magnetic field H of the current J flowing through the current conductor 2. The twisting of the LB fiber 14 is now designed so that in the no-current condition the direction of polarization of the light at the splice location 20 stands at 45° to the two mutually orthogonal axes of the HB fiber 7. Accordingly, at the splice location 20 there takes place a splitting of the linearly polarized light containing the information on the Faraday rotation into two mutually orthogonal components. The two components are passed to the polarimeter 8, separated from one another in the Wollaston prism 9 and recorded as signals $S_1$ and $S_2$ in the two photodetectors 10 and 11. As a result of the Faraday rotation of the plane of polarization of the light, the intensities of the two mutually orthogonal components and thus the magnitudes of the signals $S_1$ and $S_2$ emitted by the photodetectors 10 and 11 change. The temperature-dependent share of the position of the plane of polarization is picked up by the ratio of the two signals $S_1$ and $S_2$ and the temperature of the sensor head is determined therefrom. The signal S is determined from the two signals $S_1$ and $S_2$. Finally, the device 13 determines from the signal S a value of the current to be measured, which value takes into account the temperature dependence.

Using a sensor head 1 designed in accordance with the above embodiment, accuracies of current measurement of approximately 0.2% were achieved within a temperature range extending between −20° C. and 80° C.

| LIST OF REFERENCE SYMBOLS | |
|---|---|
| 1 | Sensor head |
| 2 | Current conductor |
| 3 | Light source |
| 4 | Polarizer |
| 5 | Detection and evaluation unit |
| 6, 7 | HB fibers |
| 8 | Polarimeter |
| 9 | Wollaston prism |
| 10, 11 | Photodetector |
| 12 | Device for the determination of the Faraday rotation |
| 13 | Device for the determination of the current value |
| 14 | LB fiber |
| 15 | Capillary |
| 16 | Coil carrier body |
| 17, 18 | Adhesive connections |
| 19, 20 | Splice locations |

Obviously, numerous modifications and variations of the present invention are possible in light of the above teachings. It is therefore to be understood that within the scope of the appended claims, the invention may be practised otherwise than as specifically described herein.

WHAT IS CLAIMED AS NEW AND DESIRED TO BE SECURED BY LETTERS PATENT OF THE UNITED STATES IS:

1. A sensor head for a fiber-optic current measuring device with a twisted low-birefringence fiber, guided around a current conductor and serving to conduct polarized light, for detecting rotation of the polarized light which is caused by the magnetic field of the current to be measured, wherein the low-birefringence fiber has two ends, said low-birefringence fiber being spliced at said two ends in each instance with one of two polarization-conserving, light-conducting fibers, one of which supplies the polarized light, and wherein the two polarization-conserving fibers are secured in each instance in a vicinity of two splice locations with absorption of torsional force generated by the twisting of the low-birefringence fiber.

2. The sensor head as claimed in claim 1, wherein the low-birefringence fiber is guided in a capillary wound in the shape of a coil.

3. The sensor head as claimed in claim 2, wherein the capillary is formed of a material having a coefficient of thermal expansion which is comparable with a coefficient of thermal expansion of material of the low-birefringence fiber.

4. The sensor head as claimed in claim 3, wherein the low-birefringence fiber and the capillary predominantly comprise quartz.

5. The sensor head as claimed in claim 4, wherein the capillary is resiliently mounted on a rigid coil carrier body.

6. The sensor head as claimed in claim 4, wherein the two polarization-conserving fibers are inserted in each instance at opposite ends into the capillary and are secured to the capillary in regions of respective insertion openings by adhesive connections.

7. The sensor head as claimed in claim 3, wherein the capillary is resiliently mounted on a rigid coil carrier body.

8. The sensor head as claimed in claim 3, wherein the two polarization-conserving fibers are inserted in each instance at opposite ends into the capillary and are secured to the capillary in regions of respective insertion openings by adhesive connections.

9. The sensor head as claimed in claim 2, wherein the capillary is resiliently mounted on a rigid coil carrier body.

10. The sensor head as claimed in claim 9, wherein the capillary is embedded in a elastomer resting on the coil carrier body.

11. The sensor head as claimed in claim 10, wherein the two polarization-conserving fibers are inserted in each instance at opposite ends into the capillary and are secured to the capillary in regions of respective insertion openings by adhesive connections.

12. The sensor head as claimed in claim 11, wherein the polarization-conserving fiber supplying the polarized light is spliced at an end remote from the low-birefringence fiber, with a fiber generating polarized light.

13. The sensor head as claimed in claim 12, wherein the two splice locations are formed by fusion.

14. The sensor head as claimed in claim 9, wherein the two polarization-conserving fibers are inserted in each instance at opposite ends into the capillary and are secured to the capillary in regions of respective insertion openings by adhesive connections.

15. The sensor head as claimed in claim 2, wherein the two polarization-conserving fibers are inserted in each instance at opposite ends into the capillary and are secured to the capillary in regions of respective insertion openings by adhesive connection.

16. The sensor head as claimed in claim 15, wherein the adhesive connections each include an elastomer.

17. The sensor head as claimed in claim 16, wherein the elastomer of said adhesive connections is silicone.

18. The sensor head as claimed in claim 1, wherein the polarization-conserving fiber supplying the polarized light is spliced at an end remote from the low-birefringence fiber, with a fiber generating polarized light.

19. The sensor head as claimed in claim 1, wherein the two splice locations are formed by fusion.

* * * * *